(12) United States Patent
Bellorado et al.

(10) Patent No.: US 8,310,386 B1
(45) Date of Patent: Nov. 13, 2012

(54) DIGITAL CONTROL OF A READ-BACK SIGNAL GAIN

(75) Inventors: Jason Bellorado, Santa Clara, CA (US); Marcus Marrow, Santa Clara, CA (US)

(73) Assignee: Link_A_Media Devices Corporation, Santa Clara, CA (US)

(*) Notice: Subject to any disclaimer, the term of this patent is extended or adjusted under 35 U.S.C. 154(b) by 148 days.

(21) Appl. No.: 12/985,244

(22) Filed: Jan. 5, 2011

Related U.S. Application Data

(60) Provisional application No. 61/335,750, filed on Jan. 11, 2010.

(51) Int. Cl.
*H03M 1/18* (2006.01)
(52) U.S. Cl. ........................... 341/139; 369/59.1
(58) Field of Classification Search .................. None
See application file for complete search history.

(56) References Cited

U.S. PATENT DOCUMENTS

| | | | |
|---|---|---|---|
| 6,037,886 A * | 3/2000 | Staszewski et al. | 341/139 |
| 7,489,750 B1 * | 2/2009 | Oberg | 375/350 |
| 7,505,537 B1 * | 3/2009 | Sutardja | 375/345 |
| 7,982,990 B1 * | 7/2011 | Yu et al. | 360/39 |
| 8,010,883 B1 * | 8/2011 | Song et al. | 714/796 |
| 8,077,816 B2 * | 12/2011 | Wong et al. | 375/345 |
| 8,081,720 B1 * | 12/2011 | Sutardja | 375/345 |
| 2004/0076245 A1 * | 4/2004 | Okamoto et al. | 375/341 |
| 2005/0174274 A1 * | 8/2005 | Delanghe et al. | 341/139 |

* cited by examiner

*Primary Examiner* — Howard Williams
(74) *Attorney, Agent, or Firm* — Van Pelt, Yi & James LLP

(57) ABSTRACT

A system for controlling a dynamic range of an analog to digital converter (ADC) signal is disclosed. The system includes an ADC configured to receive an ADC input signal and output ADC samples; an error computation block coupled to the output of the ADC and configured to compute an error based at least in part on a target and the ADC samples, wherein the target has a constraint that is indicative of a desired dynamic range of the ADC input signal; and an analog front end coupled to the input of the ADC, wherein the analog front end comprises a variable gain amplifier whose gain is adjusted based at least in part on the error.

20 Claims, 8 Drawing Sheets

DIGITAL CONTROL OF A READ-BACK SIGNAL GAIN

CROSS REFERENCE TO OTHER APPLICATIONS

This application claims priority to U.S. Provisional Patent Application No. 61/335,750 entitled DIGITAL CONTROL OF A READ-BACK SIGNAL GAIN filed Jan. 11, 2010 which is incorporated herein by reference for all purposes.

BACKGROUND OF THE INVENTION

Some communications receiver systems receive a continuous time signal that must be scaled appropriately before being sampled by an analog to digital converter (ADC) to produce sampled digitized signals. Ideally, the continuous time signal being input to the ADC is scaled appropriately to effectively utilize the full range of the ADC, otherwise, quantization noise and/or saturation from the output of the ADC can severely degrade the performance of the system. Appropriately amplifying the input signal is a difficult task given that the amplitude (prior to amplification) can rapidly change with time and be affected by a number of different factors, such as transmitter-receiver separation and weather conditions in wireless applications, or the read-head fly-height and temperature effects in magnetic storage applications. Existing techniques for controlling the amplitude have a number of drawbacks. Thus, improved techniques for controlling the gain applied to the input signal to the ADC would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
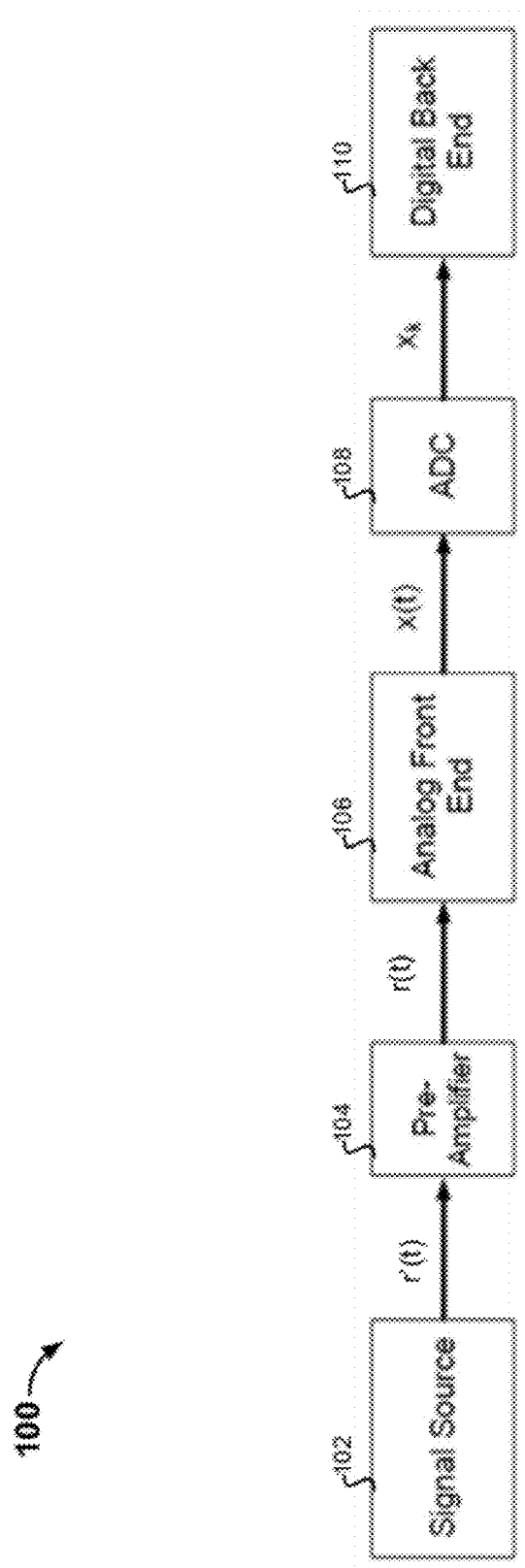
FIG. 1 is a block diagram illustrating an embodiment of a communications system receiver chain.

FIG. 1 is a block diagram illustrating an embodiment of a communications system receiver chain. As shown, communications receiver chain 100 is supplied by a signal source 102 which produces a continuous time signal r'(t). This signal is passed through a fixed-gain pre-amplifier 104, which scales the signal by a gain before applying it to the receiver's analog front end (AFE) 106. AFE 106 outputs the signal x(t), which is sampled by the analog-to-digital converter (ADC) 108. In various embodiments, AFE 106 removes high-frequencies from the input signal to prevent aliasing and ensures that the amplitude of its output signal x(t) is sufficient to effectively utilize the entire range of ADC 108.

Figure 2:
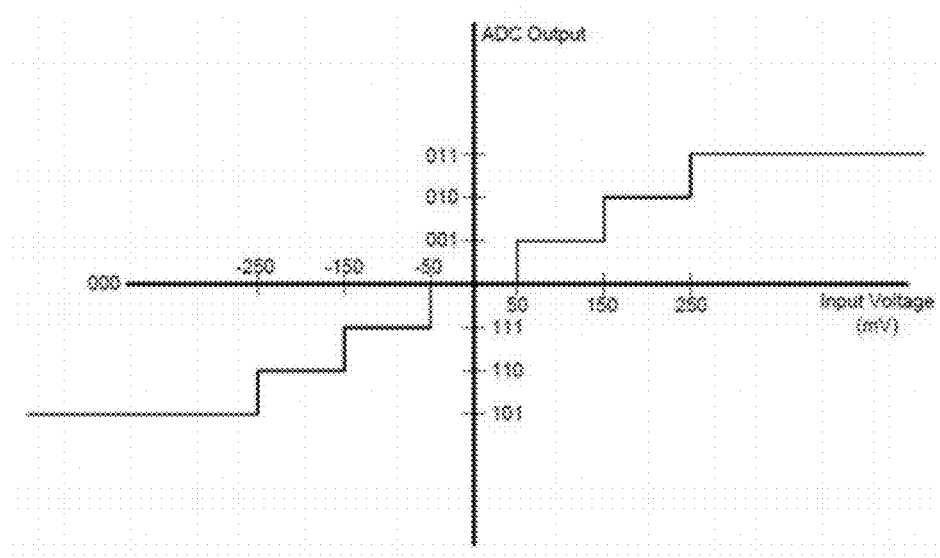
FIG. 2 is an example transfer function curve of a 3-bit ADC. In the example curve, an analog voltage (given on the x-axis) is converted or mapped by the ADC to one of 7 levels (given on the y-axis).

FIG. 2 is an example transfer function curve of a 3-bit ADC. In the example curve, an analog voltage (given on the x-axis) is converted or mapped by the ADC to one of 7 levels (given on the y-axis). If, for example, AFE 106 produces a signal which ranges between −150 mV and 150 mV, then ADC 108 would only map to 3 of the 7 levels (The 3 levels being {111, 000, 001}.). This would induce a significant amount of quantization noise at the ADC output. Conversely, if the AFE output signal ranged between −500 mV and 500 mV, then all voltages greater than 250 mV and smaller than −250 mV will all be mapped to level 011 and 101, respectively, thus mapping half of the input signal range to only 2 values. This signal distortion, referred to as saturation, will severely degrade the performance of the digital back end (DBE).

Returning to FIG. 1, it would be desirable for the amplitude of the signal x(t) to be carefully controlled by AFE 106 to prevent these negative effects. To accomplish this, the AFE 106 contains a variable-gain amplifier (VGA), which amplifies an input signal by an amount specified by a digital-to-analog converter (DAC) value. In some embodiments, for all possible conditions, the DAC value of the VGA is set to appropriately amplify the input signal.

The amplitude of r(t) can be affected by a number of different factors (e.g., transmitter-receiver separation and weather conditions in wireless applications, or the read-head fly-height and temperature effects in magnetic storage applications). This amplitude can rapidly change with time and, therefore, must be quickly tracked and compensated for to ensure a proper signal amplitude.

Techniques for controlling the signal amplitude produced by the AFE to reduce the quantization and saturation effects of analog-to-digital conversion are disclosed. In some embodiments, the gain of a received signal is controlled so as to utilize a specified range of the analog-to-digital converter by the signal portion of the received waveform. As such, this technique can reduce (e.g., maximally) the noise introduced by signal quantization and improve the SNR by saturating the additive noise that acts to corrupt a received waveform.

Figure 3:
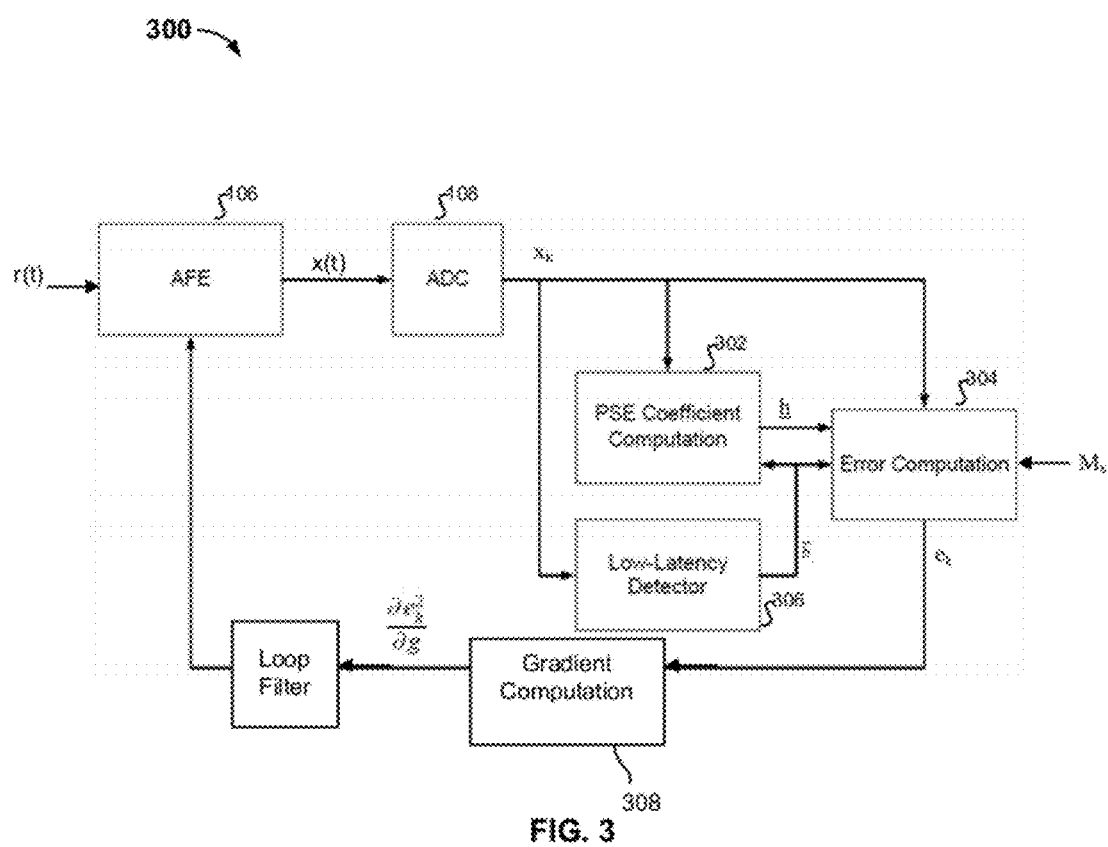
FIG. 3 is a block diagram illustrating an embodiment of a portion of a communications system receiver chain.

FIG. 3 is a block diagram illustrating an embodiment of a portion of a communications system receiver chain. In this example, system 300 is shown to include AFE 106, ADC 108, pulse shape estimate (PSE) coefficient computation block 302, error computation block 304, low latency detector 306, and gradient computation block 308. Continuous time signal r(t) is received at AFE 106. In various embodiments, r(t) may be a received signal from a communications channel, such as a wireless communications channel or a data storage read channel, such as a read-back signal obtained from magnetic disk storage or Flash storage. AFE 106 includes a VGA that is applied to signal r(t). The output of AFE 106, x(t), is input to ADC 108. The output of ADC 108, $x_k$, is input to PSE coefficient computation block 302, error computation block 304, and low latency detector 306. The output of PSE coefficient computation block 302, $h=[h_{-N} \ldots h_N]$, is input to error computation block 304. The output of low latency detector 306, $\hat{b}=\hat{b}_j$, is input to error computation block 304 and PSE coefficient computation block 302. Programmable parameter $M_x$ is input to error computation block 304, as more fully described below. The output of error computation block 304, $e_k$, is input to gradient computation block 308. The output of gradient computation block 308 is input to loop filter 310. The output of loop filter 310 fed back as input to AFE 106.

In system 300, the gain is controlled in the digital domain (i.e., post-ADC). PSE coefficient computation block 302 makes an estimate of the channel pulse-response (e.g., of a wireless communications or storage device read channel) based on the ADC samples $x_k$ and decisions $\hat{b}$ made using low-latency detector 306. In various embodiments, low-latency detector 306 may be implemented using any appropriate detector, such as a Viterbi-Detector, a slicer, or a decision feedback equalizer. The estimated channel pulse-response is distorted such that it represents a pulse-response with the desired signal amplitude. In some embodiments, the estimated channel pulse response is distorted by constraining the center tap to be a certain value using the parameter $M_x$, as more fully described below. In doing so, the error computed by error computation block 304 will reflect this distortion, causing the VGA gain (in AFE 106) to adapt. The VGA gain will settle to a value that causes the ADC signal amplitude to match the (e.g., artificially modified) pulse-shape amplitude. Since this loop is run during normal operation, the time-varying nature of the signal gain can be easily tracked in this manner.

In some gain-loop architectures, the premise is to compare the amplitude of a received signal to a target amplitude, assuaging any inconsistencies by adjusting the gain of the variable-gain amplifier (VGA) block. Typically, this comparison is made over a known data sequence. In magnetic storage applications, a preamble pattern (e.g., a repetition of the sequence [+1 +1 −1 −1] used to synchronize the sampling phase to a desired sampling phase) precedes each sector. Due to inter-symbol interference, the read-back waveform induced by this waveform is a sine wave and, thus, its amplitude may be easily calculated for comparison to a target value. These other methodologies may be undesirable for the following reasons:

1 Because the gain is calculated at the start of each sector, any intra-sector gain variations cannot be compensated for.

2 Because the gain is calculated using a read-back waveform with (e.g., significant) spectral content at a single frequency, such an architecture will keep constant the gain of only that particular frequency. In practice, however, changing channel conditions can cause the gain of the preamble frequency to change with respect to the lower frequencies found in the data portion of a sector. In such scenarios, the gain-loop will settle to a value which does not correctly compensate for these, lower, frequencies.

In some other gain-loop architectures, the gain-loop is not only run over a known data sequence, but over an entire sector by comparing the ADC samples to a fixed, signal target. Although these techniques do not suffer from the aforementioned shortcomings, they may still be undesirable for the following reasons:

1 Because the target is fixed, any change in the channel conditions will introduce error into the gain-update equations. Thus, the correct gain can only be maintained if only the channel gain varies and the channel spectrum remains constant. By contrast, in system 300, the target is changing over the data portion of the signal.

2 Because, typically, a filter is utilized to equalize to the signal target, it is easy to control the range of the filter output, however, it is extremely difficult to control the range of the filter input (i.e. the ADC samples). Thus, utilizing the entire range of the ADC is not possible with this type of architecture.

In various embodiments, the gain-loop architectures disclosed herein has one or more of the following advantages over these other architectures:

The signal amplitude applied to the digital back end can be quickly and accurately compensated for, producing a consistent signal envelope regardless of the time-varying nature of the read-back signal. This allows for optimal performance of the digital signal processing (DSP) conducted in the DBE.

The signal amplitude can be set such that the entire range of the ADC is utilized by the read-back signal (e.g., the signal plus noise signal will utilize a range greater than that of the ADC, however, this can actually improve the overall system performance due to noise saturation). This will ensure the best possible performance by maximally reducing the effects of both saturation and quantization.

Although this loop is closed digitally, the use of low latency detector 306 and the minimal delay along the path of gain compensation (i.e., ADC samples are directly utilized) enables gain compensation to be conducted with minimal latency.

In system 300, by using an estimate of the channel pulse-response, the expected read-back signal for any known data pattern is known. Thus, the gain may be controlled in such a manner that any desired signal amplitude at the ADC output may be achieved by an adjustment of the VGA gain. In order to achieve this effect, the pulse-shape estimate is distorted to reflect the desired signal amplitude.

In various embodiments, equation 6 (described below) is used in error computation 304, equations 7 and/or 8 (described below) are used in PSE coefficient computation 302 and/or equation 13 is used in gradient computation 308.

Figure 4:
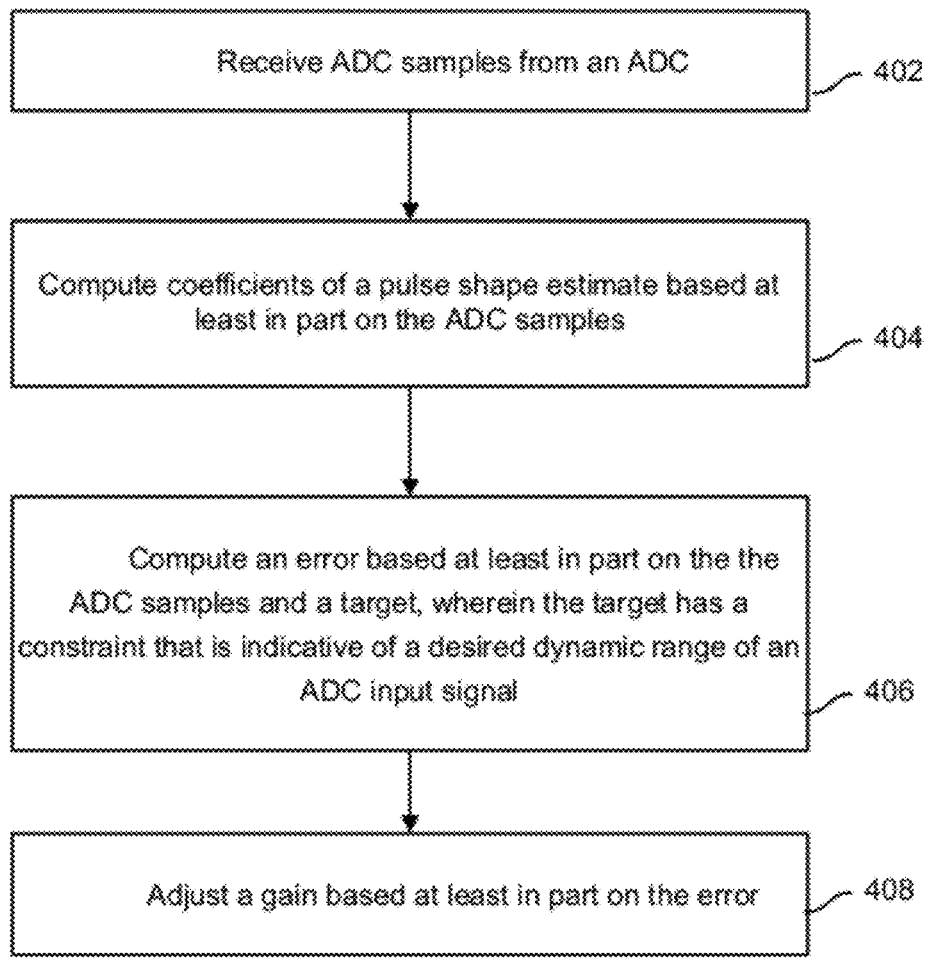
FIG. 4 is a flow chart illustrating an embodiment of a process for controlling a dynamic range of an input signal to an ADC.

FIG. 4 is a flow chart illustrating an embodiment of a process for controlling a dynamic range of an input signal to an ADC. More specifically, the dynamic range of the signal portion of an input signal to an ADC is controlled. For example, if the signal portion is too small, the gain will increase to appropriately set the level of the signal portion of the read-back waveform. This will increase the level of both the signal and noise components of the read-back waveform, however, the architecture ensures that the signal component will not exceed the maximum (or minimum) ADC input levels. It may be the case, however, that noise causes this maximum (or minimum) level to be exceeded. In this event, the excess noise is saturated from (effectively cut off) the read-back waveform, thus improving the quality of the signal.

This property is discussed more fully below.

In this example, embodiments are described with respect to a magnetic storage system. In some embodiments, this process is performed by various blocks in system 300.

At 402, ADC samples are received from an ADC. For example, in system 300, ADC samples $x_k$ are received from ADC 108. The values of the ADC samples $x_k$ may be expressed as the summation of the signal $s_k$ and noise $n_k$ components of the read-back waveform, $$x_k = s_k + n_k, \quad (1)$$

where the signal is expressed in terms of the written data $\{b_k, k=-\infty, \ldots, \infty\}$, where $b_k \in \{-1, +1\}$, and the channel pulse-response $\{h_k, k=-\infty, \ldots, \infty\}$, as $$s_k = \sum_{i=-\infty}^{\infty} h_i \cdot b_{k-i}. \quad (2)$$

Figure 5:
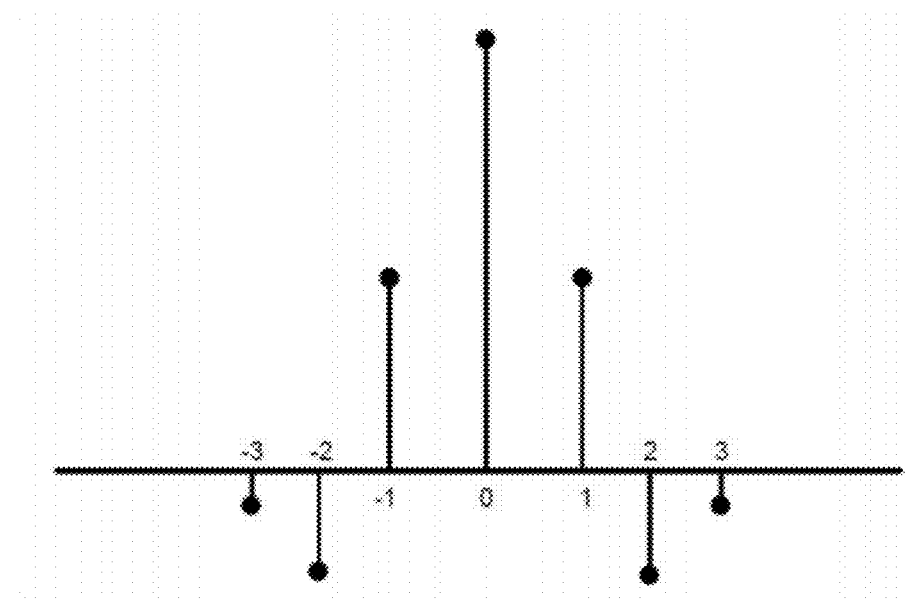
FIG. 5 is a diagram illustrating an example of a channel pulse-response in a magnetic recording channel

Turning temporarily to FIG. 5, that figure is a diagram illustrating an example of a channel pulse-response in a magnetic recording channel. In practical applications, the channel pulse-response is of finite-length in that the output sample at time k ($x_k$) is only influenced by the bits which are written in close proximity of it. In this example, the channel has 7 taps, the pulse shape estimate coefficients $h_{-3}$, $h_{-2}$, $h_{-1}$, $h_0$, $h_1$, $h_2$, and $h_3$. Thus, (1) may be expressed as, $$x_k = \sum_{i=-N}^{N} h_k \cdot b_{k-i} + n_k, \quad (3)$$

where the support length of the channel pulse-response is (2N+1).

From (3), given the channel pulse-response $h=h_{-N}, h_{-N+1}, \ldots, h0, \ldots, h_{N-1}, h_N$), the minimum and maximum of the signal portion of the ADC samples are given by, $$s_{min} = -\sum_{i=-N}^{N} |h_i| \quad (4)$$

$$s_{max} = \sum_{i=-N}^{N} |h_i|, \quad (5)$$

where the minimum ADC sample is achieved for the data sequence for which $\text{sign}(b_k) \neq \text{sign}(h_k)$, $k=-N, \ldots, N$ and the maximum ADC sample is achieved for the data sequence for which $\text{sign}(b_k) = \text{sign}(h_k)$, $k=-N, \ldots, N$. Note that this is only the maximum/minimum value for the signal portion of the ADC sample ($s_k$), however, the ADC sample itself ($s_k+n_k$) may be larger (smaller) than these maximum (minimum) values.

In some embodiments, to estimate the pulse-shape coefficients, a least-squares criterion may be utilized, in which the error between the received ADC samples and the estimated ADC samples is formed as, $$e_k = x_k - s_k \quad (6)$$

$$= x_k - \sum_{i=-N}^{N} h_i \cdot b_{k-i}.$$

During normal operation, the values of $b_i$ may be substituted for using decisions $\hat{b}_i$ (supplied by low-latency detector 306). Thus, the derivative of the squared error $e^2_k$ with respect to a channel pulse-response tap $h_j$ is given as, $$\frac{\partial e_k^2}{\partial h_j} = -2 \cdot e_k \cdot b_{k-j} \quad (7)$$

$$= -2 \cdot \left[ x_k - \sum_{i=-N}^{N} h_i \cdot b_{k-i} \right] b_{k-j}.$$

As is the case in least-squares parameter estimation, the gradient given as (7) is formulated for each tap and continually applied to each tap to update their values.

There are an infinite number of solutions to this problem when the capability of the VGA to scale the signal is taken into account. For example (ignoring saturation and quantization effects for a moment), assume that the pulse-shape coefficients have converged to their least-squares values for the current VGA gain setting. The VGA can then be adjusted such that the resultant signal amplitude is doubled, which will result in all the PSE coefficients doubling as well. This reasoning may be carried out for any scale value and, therefore, we are free to jointly choose both the VGA gain value and the PSE coefficients arbitrarily.

Since the PSE coefficients can be used to determine the amplitude of the signal portion of the ADC samples, they are used to construct a pulse-shape of the desired amplitude. For this, the channel pulse-response is estimated by adapting all of the taps except for the center-tap $h_0$ (i.e., ($h_{-N}$, $h_{-N+1}$, ..., $h_{-1}$, $h_1$, ..., $h_{N-1}$, $h_N$)) using the least-squares criterion discussed above. The center-tap, however, is slaved to the remaining estimates as, $$h_0 = M_x - \sum_{\substack{i=-N \\ i \neq 0}}^{N} |h_i|, \quad (8)$$

where $M_x$ is a parameter that is programmable and may be set by the user. Note that by substituting (8) into equations (4) and (5), the following is obtained, $$s_{min} = -M_x \quad (9)$$

$$s_{max} = M_x, \quad (10)$$

and, therefore, the amplitude of the signal portion of the ADC samples is set to $M_x$. The target has a constraint that is indicative of a desired dynamic range of an ADC input signal. In this case, the target is $h_i$, the expected target waveform is $$\sum_{i=-N}^{N} h_i \cdot b_{k-i},$$

and the constraint on the target is equation 8.

Although a least-squares technique is used in this example, in various embodiments, any appropriate criterion/technique may be used.

By (artificially) setting the value of $h_0$ as given in (8), the pulse-shape will be constrained to have a dynamic range set by $M_x$. Although the pulse-shape is so constrained, the VGA must act to match the ADC samples with that indicated by the pulse-shape. For this, the ADC sample is expressed in terms of the VGA gain g as, $$x_k \approx g \cdot r_k \quad (11)$$

where $r_k$ is a sample of the random process r(t) (note that the "≈" in (11) is because, in general, there are other operations, such as filtering, conducted in the AFE and, therefore, (11) does not exactly hold). Substituting (11) into the error (given as equation (6)) and taking the derivative of the squared error with respect to g yields, $$\frac{\partial e_k^2}{\partial g} = 2 \cdot e_k \cdot r_k \quad (12)$$

$$= 2 \cdot \left[ x_k - \sum_{i=-N}^{N} h_i \cdot b_{k-i} \right] \cdot r_k.$$

Note that, due to the relation given in (11), $r_k$ in (12) may be replaced by $x_k$. The reason for this is because a gradient is first scaled by a step-size η before being added to the parameter and, therefore, the value of g is just absorbed into this step-size. The gradient is then, finally, expressed as, $$\frac{\partial e_k^2}{\partial g} = 2 \cdot \left[ x_k - \sum_{i=-N}^{N} h_i \cdot b_{k-i} \right] \cdot x_k. \quad (13)$$

For example, gradient computation block 308 outputs $$\frac{\partial e_k^2}{\partial g}.$$

By setting the value of $h_0$ as given by (8), the estimated pulse-shape is manipulated such that the signal envelope (as indicated by the PSE) is bounded by the parameter $M_x$. Using the gain update equation given as (13), the gain-loop will react so as to set the gain which forces this to be the case. Thus, the gain-loop will adjust to make the ADC samples satisfy the constraint imposed by the pulse-shape.

Returning to FIG. 4, at 404, coefficients of a pulse shape estimate are computed based at least in part on the ADC samples. For example, pulse shape estimate computation block 302 computes pulse shape estimate coefficients $[h_{-N} \ldots h_N]$ using a least squares technique, as described above (e.g., equations 7 and 8).

At 406, an error is computed based at least in part on a target and the ADC samples. For example, error computation block 304 computes error $e_k$ based on $x_k$, $[h_{-N} \ldots h_N]$, $\hat{b}_i$, and a parameter $M_x$, as more fully described above (e.g., equation 6). The target has a constraint that is indicative of a desired dynamic range of an ADC input signal, as described above.

At 408, a gain is computed based at least in part on the error. For example, gradient computation block 308 computes a gradient based at least in part on error $e_k$ using equation 13. The gradient is fed back to AFE 106, which computes a gain g for a VGA in AFE 106. AFE 106 outputs signal x(t) that have an appropriate amplitude to fully utilize the full dynamic range of ADC 108. Signal x(t) has a signal portion and a noise portion. The signal portion of x(t) has the full dynamic range of the ADC. In various embodiments, Mx can be adjusted so that the signal portion of x(t) has any desired dynamic range.

The objective of any gain-loop is to keep the signal amplitude constant, as is expected by the DSP in the digital back end, through changing signal conditions. Although the disclosed gain-loop architecture also accomplishes this goal, it also has some distinct benefits over a traditional gain-loop architecture. Most notably, this architecture allows for an automatic scaling of the signal envelope to any value using the parameter $M_x$, which has several benefits:

1 Scaling the signal to utilize the entire dynamic range of the ADC minimizes the effects of quantization, which are unavoidable in a sampled data system.

Figure 6:
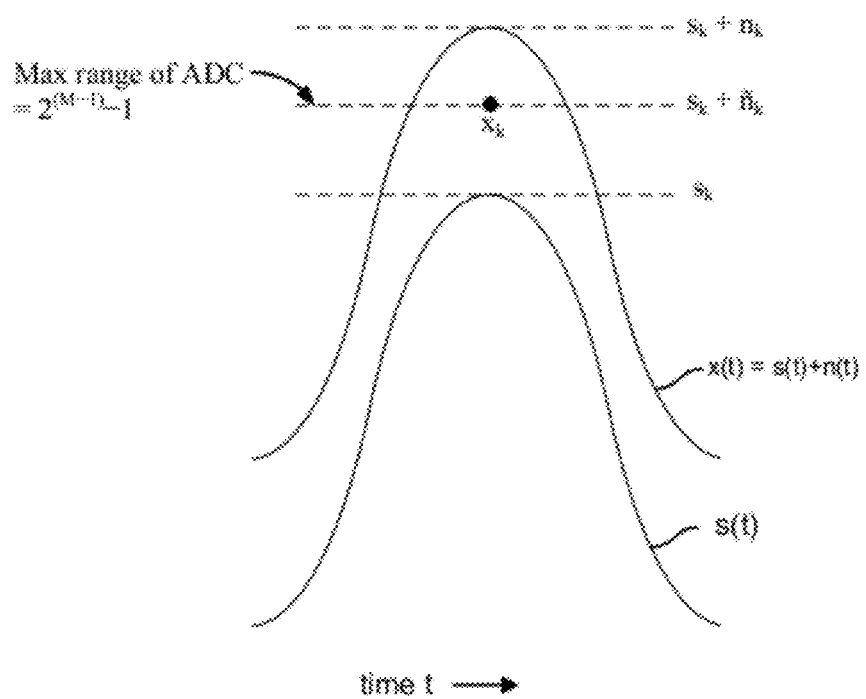
FIG. 6 is a diagram illustrating an example of a signal plus noise, where noise is saturated.

2 FIG. 6 is a diagram illustrating an example of a signal plus noise, where noise is saturated. As described above, the dynamic range of the signal portion of the ADC samples is equivalent to the parameter $M_x$. Thus, for an M-bit ADC (which produces levels in the range $\{-2^{(M-1)}, 2^{(M-1)}-1\}$), the signal portion of the ADC will not saturate provided $M_x \leq 2^{(M-1)}-1$, which yields, $$s_k \leq 2^{(M-1)}-1. \quad (14)$$

The ADC samples, however, (which are signal plus noise) may saturated due to the addition of noise. In the event that $(s_k+n_k)$ is saturated $$(s_k+n_k) > 2^{(M-1)}-1, \quad (15)$$

however, $$x_k = 2^{(M-1)}-1 = (s_k+\tilde{n}_k). \quad (16)$$

Because the signal sample ($s_k$) is not saturated, it is the noise sample ($n_k$) which is saturated, i.e, $$|\tilde{n}_k| < |n_k|. \quad (17)$$

Therefore, by setting the dynamic range of the signal portion to utilize the entire range of the ADC, any samples which are saturated actually have a reduction in noise, as shown in FIG. 6. Thus, the SNR is actually improved due to this type of saturation.

3. In magnetic recording applications, some other gain-loops take advantage of the fact that known data is written to the disk which precedes each sector. This known data, known as a preamble, is a repeated pattern of [+1 +1 −1 −1] which, when read from the disk, takes the form of a sinusoid with period equal to 4T (where T is the sampling period). Since sampling the preamble represents 4 (equally-spaced) samples of a sinusoid over a single period, there exist easy methods of computing its amplitude. Generally, the computed amplitude is compared to a target amplitude and the VGA gain corrected to set the preamble amplitude to be equivalent to the target.

Although this other gain loop technique is effective at achieving a consistent gain during the preamble region, it does have the shortcoming that it does not attempt to control the gain for other frequencies. For example, a current issue in the magnetic recording industry is the effect of adjacent track interference (known as ATE or ATI). In such, by writing a track multiple times, the fringe-field produced by the write process acts to degrade the data written on adjacent tracks.

The effect of this interference is an overall attenuation of only the low-frequency content of the read-back signal of a victim track; however, there is very little attenuation at higher frequencies. Thus, the preamble frequency is left unchanged while data-patterns of lower frequencies (such as those which occur during the random-data portion of the sector) are reduced in amplitude. If this other gain-loop methodology is used to control the gain, the VGA will not compensate for such gain changes (since the preamble pattern is unaffected), which will cause a significant performance degradation. In contrast, the disclosed techniques compensate for such changes because it is the low-frequency patterns that produce the largest read-back waveform.

Figure 7:
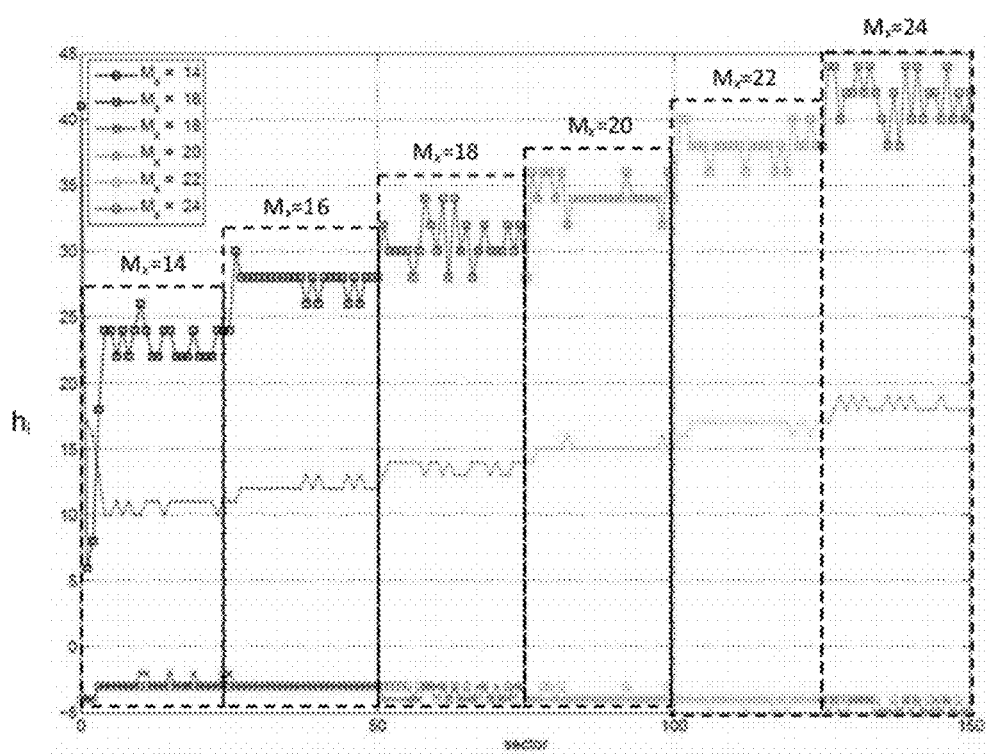
FIG. 7 is a diagram illustrating an exemplary plot of PSE coefficients for various values of $M_x$.

FIG. 7 is a diagram illustrating an exemplary plot of PSE coefficients for various values of $M_x$. An experiment was conducted on a 2.5" hard-disk drive in which the pulse-shape estimation block and the gain-loop were allowed to converge for a range of values of $M_x$. This example used a 7-tap pulse-shape in which a symmetry constraint was imposed (i.e. $h_i = h_{-i}$, i=1, 2, 3) and, therefore, 4 curves are provided in FIG. 7 (the square markers indicate $h_0$, the dot markers indicate $h_1$ and $h_{-1}$, the circle markers indicate $h_2$ and $h_{-2}$, and the × markers indicate $h_3$ and $h_{-3}$). In this experiment, 25 sectors were read for each value of $M_x$ in the set {14, 16, 18, 20, 22, 24}. After each sector-read, the values of the PSE coefficients were noted and the ADC samples for that sector collected.

As can be seen in FIG. 7, by increasing the value of $M_x$ from 14 to 24, the estimated pulse-shape coefficients expand to fit the constraint imposed by (8). It is clear that this constraint acts to scale the pulse shape by a constant factor, which is compensated for by the VGA.

Figure 8:
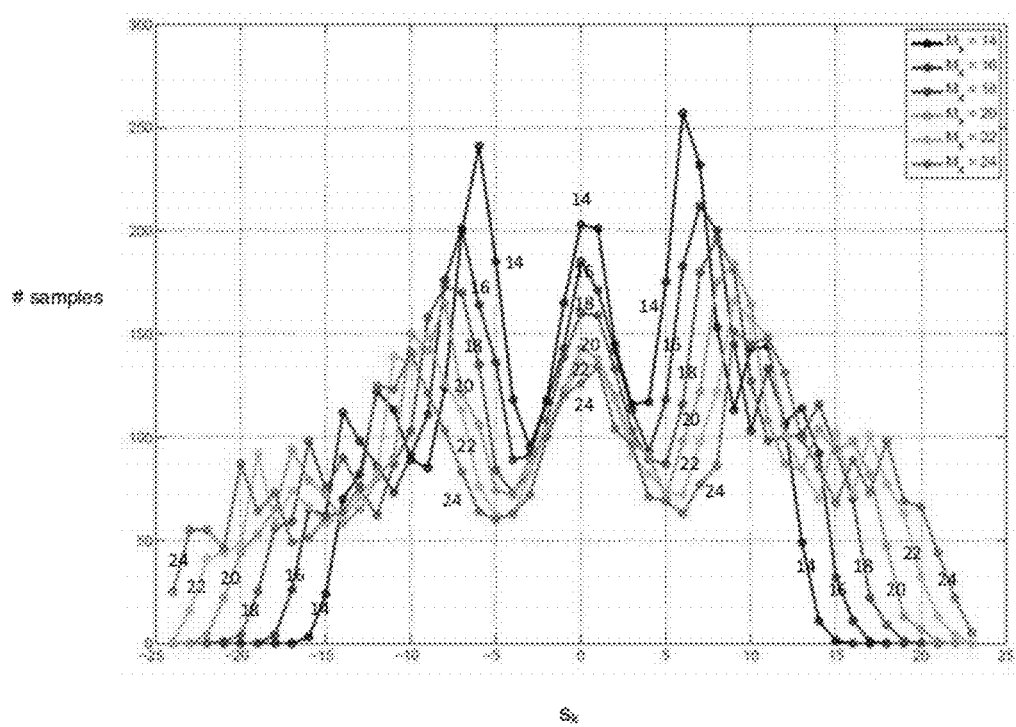
FIG. 8 is a diagram illustrating exemplary histograms of the signal portion of the ADC samples for various values of $M_x$.

FIG. 8 is a diagram illustrating exemplary histograms of the signal portion of the ADC samples for various values of $M_x$. To demonstrate that the constraint imposed by equation (8) effectively limits the ADC range, the experiment of FIG. 7 was re-conducted; however, 500 sectors were read for each value of $M_x$. Since these sectors were all written with the same data pattern, all sectors read with the same value of $M_x$ were averaged to obtain the signal portion of the ADC samples. (Because the samples are averaged, noise is mostly removed from the signal, leaving mostly the signal portion.) As shown in the histograms, the disclosed techniques are very effective at setting the range of the signal portion of the ADC samples. In other words, the bigger $M_x$, the wider the range of signal values $s_k$. For example, $M_x=24$ yields signal values $s_k$ ranging between −24 to 24, while $M_x=14$ yields signal values $s_k$ ranging between −16 to 14. According to equations 9 and 10, $s_{min}=-M_x$ and $s_{max}=M_x$. When $M_x=14$, there are some signal values at −15 and −16 because setting $M_x$ to 14 only sets the maximum/minimum value of the signal portion of the read-back waveform to +/−14. When noise is added, the waveform can go outside this range.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
    an analog to digital converter (ADC) configured to receive an ADC input signal and output ADC samples;
    a low latency detector configured to receive the ADC samples and output decisions, wherein a target waveform is the convolution of a pulse shape estimate with low latency detector decisions;
    an error computation block coupled to the output of the ADC and configured to compute an error based at least in part on: (1) a target, (2) the low latency detector decisions, and (3) the ADC samples, wherein the target has a constraint that is indicative of a desired dynamic range of the ADC input signal; and
    an analog front end coupled to the input of the ADC, wherein the analog front end comprises a variable gain amplifier whose gain is adjusted based at least in part on the error.

2. The system recited in claim 1, further including a pulse shape estimator configured to receive the ADC samples and compute coefficients of a pulse shape estimate based at least in part on the ADC samples.

3. The system recited in claim 2, wherein a target waveform is computed based at least in part on the coefficients of the pulse shape estimate.

4. The system recited in claim 1, wherein a target waveform is computed based at least in part on the pulse shape estimate and low latency detector decisions.

5. The system recited in claim 1, wherein the pulse shape estimator uses a least squares technique to estimate at least one of: the center coefficient or the non-center coefficients of the pulse shape estimate.

6. The system recited in claim 1, wherein the ADC input signal has a signal portion and a noise portion and adjusting the gain causes the signal portion of the input to the ADC to have the desired dynamic range.

7. The system recited in claim 6, wherein, if the ADC input signal is saturated by the ADC, only the noise portion of the ADC input signal is saturated.

8. The system recited in claim 1, wherein the pulse shape is associated with a read channel of a data storage system.

9. The system recited in claim 1, wherein the ADC input signal has a preamble portion and a data portion, and the gain is adjusted over the data portion of the ADC input signal.

10. The system recited in claim 9, wherein the target is changing over the data portion of the ADC input signal.

11. The system recited in claim 1, wherein the output of the ADC is directly coupled to the input to the low latency detector.

12. A system, comprising:
    an analog to digital converter (ADC) configured to receive an ADC input signal and output ADC samples;
    an error computation block coupled to the output of the ADC and configured to compute an error based at least in part on a target and the ADC samples, wherein:
        the target has a constraint that is indicative of a desired dynamic range of the ADC input signal; and
        the constraint further includes that a center coefficient of a pulse shape estimate is equal to the desired dynamic range of the ADC signal minus the sum of the absolute value of all non-center coefficients of the pulse shape estimate; and
    an analog front end coupled to the input of the ADC, wherein the analog front end comprises a variable gain amplifier whose gain is adjusted based at least in part on the error.

13. A method, comprising:
    receiving analog to digital converter (ADC) samples from an ADC that is configured to receive an ADC input signal;
    using a processor to compute an error based at least in part on the ADC samples and a target, wherein:
        the target has a constraint that is indicative of a desired dynamic range of an ADC input signal; and the constraint further includes that the center coefficient of the pulse shape estimate is equal to the desired dynamic range of the ADC signal minus the sum of the absolute value of all non-center coefficients of the pulse shape estimate; and adjusting a gain based at least in part on the error.

14. The method recited in claim 13, further including computing coefficients of a pulse shape estimate based at least in part on the ADC samples.

15. The method recited in claim 14, wherein a target waveform is computed based at least in part on the pulse shape estimate and low latency detector decisions.

16. The method recited in claim 13, wherein adjusting the gain causes the signal portion of the input to the ADC to have the desired dynamic range.

17. The method recited in claim 13, wherein the ADC input signal has a preamble portion and a data portion, and the gain is adjusted over the data portion of the ADC input signal.

18. A computer program product, the computer program product being embodied in a non-transitory computer readable storage medium and comprising computer instructions for:

receiving analog to digital converter (ADC) samples from an ADC that is configured to receive an ADC input signal;

computing an error based at least in part on the ADC samples and a target, wherein:

the target has a constraint that is indicative of a desired dynamic range of an ADC input signal; and the constraint further includes that the center coefficient of the pulse shape estimate is equal to the desired dynamic range of the ADC signal minus the sum of the absolute value of all non-center coefficients of the pulse shape estimate; and adjusting a gain based at least in part on the error.

19. A method, comprising:

receiving analog to digital converter (ADC) samples from an ADC that is configured to receive an ADC input signal;

generating decisions using a low latency detector configured to receive the ADC samples, wherein a target waveform is the convolution of a pulse shape estimate with low latency detector decisions;

using a processor to compute an error based at least in part on: (1) a target, (2) the low latency detector decisions, and (3) the ADC samples, wherein the target has a constraint that is indicative of a desired dynamic range of the ADC input signal; and adjusting a gain based at least in part on the error.

20. A computer program product, the computer program product being embodied in a non-transitory computer readable storage medium and comprising computer instructions for:

receiving analog to digital converter (ADC) samples from an ADC that is configured to receive an ADC input signal;

generating decisions using a low latency detector configured to receive the ADC samples, wherein a target waveform is the convolution of a pulse shape estimate with low latency detector decisions;

computing an error based at least in part on: (1) a target, (2) the low latency detector decisions, and (3) the ADC samples, wherein the target has a constraint that is indicative of a desired dynamic range of the ADC input signal; and adjusting a gain based at least in part on the error.

* * * * *